United States Patent
Choi et al.

(10) Patent No.: US 9,824,952 B2
(45) Date of Patent: Nov. 21, 2017

(54) LIGHT EMITTING DEVICE PACKAGE STRIP

(71) Applicant: LUMENS CO., LTD., Yongin-si, Gyeonggi-do (KR)

(72) Inventors: Hong-Geol Choi, Yongin-si (KR); Sung-Ok Choi, Yongin-si (KR); Sang-Hyub Gim, Yongin-si (KR); Seung-Hyun Oh, Yongin-si (KR); Yun-Geon Cho, Yongin-si (KR); Bo-Gyun Kim, Yongin-si (KR); Suk-Min Han, Yongin-si (KR); Jun-Hyeok Han, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/086,082

(22) Filed: Mar. 31, 2016

(65) Prior Publication Data
US 2016/0293815 A1    Oct. 6, 2016

(30) Foreign Application Priority Data

Mar. 31, 2015 (KR) .................. 10-2015-0045495
Dec. 23, 2015 (KR) .................. 10-2015-0184836

(51) Int. Cl.
*H01L 23/31* (2006.01)
*H01L 33/60* (2010.01)
(Continued)

(52) U.S. Cl.
CPC .......... *H01L 23/3157* (2013.01); *H01L 23/04* (2013.01); *H01L 23/31* (2013.01);
(Continued)

(58) Field of Classification Search
CPC ......... H01L 23/02; H01L 23/04; H01L 23/10; H01L 23/28; H01L 23/293; H01L 23/31;
(Continued)

(56) References Cited

U.S. PATENT DOCUMENTS

| 7,329,905 B2 | 2/2008 | Ibbetson et al. |
| 2012/0248481 A1* | 10/2012 | Seo ........................ H01L 33/486 257/98 |

(Continued)

FOREIGN PATENT DOCUMENTS

| JP | 2012-119673 | 6/2012 |
| JP | 2014-110333 | 6/2014 |

(Continued)

OTHER PUBLICATIONS

Korean Office Action dated May 22, 2015 in Korean Patent Application No. 10-2015-0045495, 5 pgs.

(Continued)

*Primary Examiner* — Eduardo A Rodela
(74) *Attorney, Agent, or Firm* — Ichthus Internationl Law, PLLC

(57) ABSTRACT

Disclosed herein is a light emitting device package strip capable of being used for a display application or an illumination application. The light emitting device package strip may include: a light emitting device package; and an upper adhesive sheet attached onto an upper surface of the light emitting device package so as to support the light emitting device package, wherein the light emitting device package includes: a flip-chip light emitting device having a first electrode pad and a second electrode pad; and a molding member formed to enclose side surfaces and an upper surface of the light emitting device such that the first electrode pad and the second electrode pad are exposed.

6 Claims, 14 Drawing Sheets

(51) Int. Cl.
*H01L 33/50* (2010.01)
*H01L 25/075* (2006.01)
*H01L 23/04* (2006.01)

(52) U.S. Cl.
CPC ...... *H01L 23/3171* (2013.01); *H01L 23/3185* (2013.01); *H01L 25/0753* (2013.01); *H01L 33/507* (2013.01); *H01L 33/60* (2013.01); *H01L 2224/16225* (2013.01); *H01L 2224/97* (2013.01); *H01L 2924/181* (2013.01); *H01L 2933/0033* (2013.01)

(58) Field of Classification Search
CPC ............. H01L 23/3107; H01L 23/3157; H01L 23/3171; H01L 23/3178; H01L 23/3185
See application file for complete search history.

(56) References Cited

U.S. PATENT DOCUMENTS

2013/0193464 A1* 8/2013 Bae ..................... H01L 33/405
257/94

2015/0221623 A1* 8/2015 Tischler ................ H01L 25/165
257/89
2016/0276238 A1* 9/2016 Lin ..................... H01L 23/3128

FOREIGN PATENT DOCUMENTS

| JP | 2015-128188 | 7/2015 |
| KR | 10-2009-0102121 A | 9/2009 |
| KR | 10-2012-0117662 A | 10/2012 |
| KR | 10-2013-0021129 A | 3/2013 |
| KR | 10-2014-0062957 A | 5/2014 |

OTHER PUBLICATIONS

Korean Office Action dated Dec. 13, 2016 in Korean Patent Application No. 10-2015-0184836, 6 pgs.

Korean Office Action dated Jun. 26, 2017 in Korean Patent Application No. 10-2015-0184836, 7 pgs.

* cited by examiner

LIGHT EMITTING DEVICE PACKAGE STRIP

CROSS REFERENCE TO RELATED APPLICATION(S)

This application claims priority to Korean Patent Application No. 10-2015-0045495, filed on Mar. 31, 2015, and Korean Patent Application No. 10-2015-0184836, filed on Dec. 23, 2015, the contents of which are incorporated herein by reference in their entirety.

BACKGROUND

Field

The present invention relates to a light emitting device package strip, and more particularly, to a light emitting device package strip capable of being used for a display application or an illumination application.

Description of the Related Art

A light emitting diode (LED) indicates a kind of semiconductor device capable of implementing various colors of light by forming a PN diode using a compound semiconductor to configure a light emitting source. The LED has a long lifespan, may be miniaturized and become light, and may be driven at a low voltage. In addition, the LED is robust to impact and vibration, does not require a preheating time and complicated driving, and may be mounted in various shapes on a substrate or a lead frame and be then packaged, such that the LED may be modularized for several applications and be used in a backlight unit, various illumination apparatuses, or the like.

SUMMARY

Generally, a method of manufacturing a light emitting device package includes a process of mounting light emitting devices on a substrate one by one and forming a reflecting member and a light conversion member in each of the light emitting devices. However, a lot of time and cost are required for a packaging process, and an increase in a cost of a product and a decrease in productivity are generated in manufacturing the product due to miniaturization and thinness of the light emitting device package. As a result, sizes or thicknesses of the manufactured light emitting device packages are relatively large, such that the product may not be miniaturized and thinned.

In order to solve these problems, a chip scale package (CSP) process of mounting a plurality of light emitting devices, forming optical members en bloc, and then individualizing a package has been used so as to enable miniaturization and thinness of the package. In the chip scale package process, when the plurality of light emitting devices are mounted on the substrate, the plurality of light emitting devices are arranged and mounted such that intervals therebetween correspond to an artificial dimension. However, it is difficult to maintain uniform intervals at the time of mass production due to an accumulated error of an equipment. Therefore, when an arrangement of the light emitting devices is not uniformly maintained, after the package is individualized, the light emitting devices are damaged or an amount of phosphor of the individualized package is not uniform, such that a defect of optical characteristics may appear. In addition, in the chip scale package process, a flip-chip light emitting device having electrode pads attached onto a lower surface thereof is mainly used, and thus, it is difficult to perform a process for testing whether or not a defect of the light emitting device occurs.

The present invention is to solve several problems including the problems as described above, and an object of the present invention is to provide a light emitting device package strip in which a defect of a light emitting device package may be reduced through a chip scale package process capable of uniformly arranging light emitting devices, heights and side surface thicknesses of phosphors applied to the respective light emitting devices may be uniform, optical characteristics may be improved, efficiency of a test process may be improved, and a process time may be reduced. However, this object is only an example, and the scope of the present invention is not limited thereto.

According to an exemplary embodiment of the present invention, a light emitting device package strip may include: a light emitting device package; and an upper adhesive sheet attached onto an upper surface of the light emitting device package so as to support the light emitting device package, wherein the light emitting device package includes: a flip-chip light emitting device having a first electrode pad and a second electrode pad; and a molding member formed to enclose side surfaces and an upper surface of the light emitting device such that the first electrode pad and the second electrode pad are exposed.

The molding member may have downwardly inclined surfaces formed on side surfaces thereof such that a second width of an upper portion thereof is wider than a first width of a lower portion thereof.

The molding member may include a preformed reflector sheet including an upper surface, a lower surface, and a hole connected from the upper surface to the lower surface, the flip-chip light emitting device may be inserted and fixed into the hole, and the first electrode pad and the second electrode pad may be exposed to the outside of the hole.

The light emitting device package may further include a phosphor sheet attached onto the upper surface of the preformed reflector sheet so as to close an upper portion of the hole.

The upper surface of the light emitting device and the upper surface of the preformed reflector sheet may be coplanar with each other, and the phosphor sheet may be attached onto both of the upper surface of the light emitting device and the upper surface of the preformed reflector sheet.

A height of the light emitting device may be the same as a height of the preformed reflector sheet and a depth of the hole.

The side surfaces of the light emitting device may contact inner side surfaces of the hole.

The light emitting device may include a first conductive-type semiconductor layer, an active layer, and a second conductive type semiconductor layer sequentially disposed from the top toward the bottom, and may be a flip-chip light emitting device in which a first conductive-type pad of a region of the first conductive-type semiconductor layer opened by mesa etching and a second conductive-type pad of a region of the second conductive-type semiconductor layer are bonded to the first electrode pad and the second electrode pad, respectively.

The light emitting device may include facing side surfaces facing inner side surfaces of the hole, and the facing side surfaces may include side surfaces of the first conductive-type semiconductor layer and side surfaces of the first or second electrode pad.

The preformed reflector sheet may be manufactured from a sheet for a reflector preformed by mixing one or more reflecting materials selected from the group consisting of $TiO_2$, $SiO_2$, $ZrO_2$, $PbCO_3$, $PbO$, $Al_2O_3$, $ZnO$, and $Sb_2O_3$ with a resin at least partially including a silicon resin or an epoxy resin.

DETAILED DESCRIPTION

Figure 1:
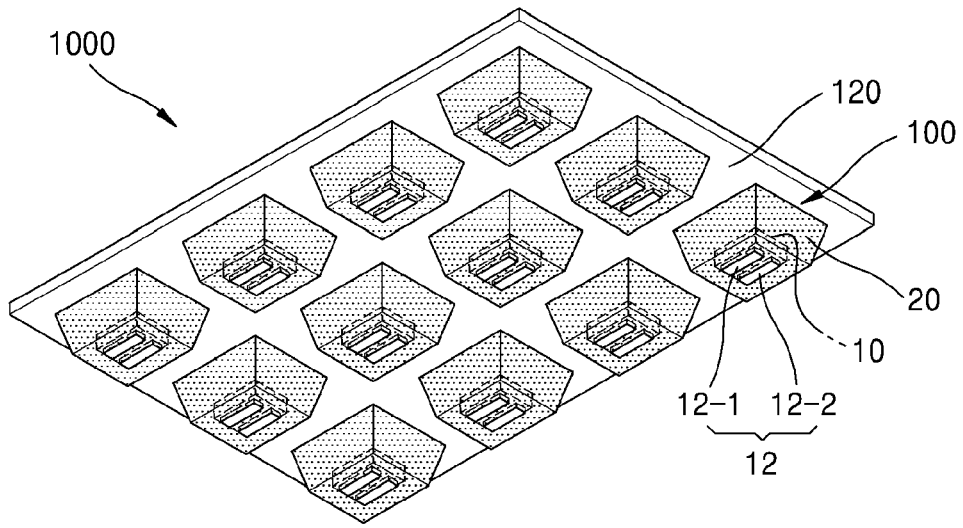
FIG. 1 is a perspective view illustrating a light emitting device package strip according to an exemplary embodiment of the present invention.

Hereinafter, several exemplary embodiments of the present invention will be described in detail with reference to the accompanying drawings.

Exemplary embodiments of the present invention will be provided only in order to further completely describe the present invention to those skilled in the art, the following exemplary embodiments may be modified into other several forms, and the scope of the present invention is not limited to the following exemplary embodiments. Rather, these exemplary embodiments make the present disclosure thorough and complete, and are provided in order to completely transfer the spirit of the present invention to those skilled in the art. In addition, thicknesses or sizes of the respective layers in the drawings have been exaggerated for convenience and clarity of explanation.

A chip scale package (CSP) mentioned in the present invention, which is a technology of forming a light emitting device package in a chip scale unit, is configured by mounting a plurality of light emitting devices on a substrate strip, applying a phosphor en bloc, and performing singulation. Here, a size of the chip scale package is substantially similar to that of the light emitting device or is slightly larger than that of the light emitting device within a range of 20%. This package does not require an additional sub-mount or substrate, and may be directly connected to a board.

In addition, the chip scale package, which is a surface mount device (SMD) having a PN junction, has a simple bonding pad space to thereby be subjected to a standard test without an additional complicated process. The chip scale package has a size smaller than that of an existing light emitting device package, may form density higher than that of the existing light emitting device package to reduce a cost, has a process simpler than that of the existing light emitting device package, and has thermal resistance capability and uniformity of colors higher than those of the existing light emitting device package.

FIG. 1 is a perspective view illustrating a light emitting device package strip 1000 according to an exemplary embodiment of the present invention.

First, as illustrated in FIG. 1, the light emitting device package strip 1000 according to an exemplary embodiment of the present invention may include a light emitting device package 100 and an upper adhesive sheet 120. In more detail, for example, the upper adhesive sheet 120 may be attached onto an upper surface of the light emitting device package so as to support the light emitting device package 100.

In addition, the light emitting device package 100 may include a flip-chip light emitting device 10 having a first electrode pad 12-1 and a second electrode pad 12-2, and a molding member 20 formed to enclose side surfaces and an upper surface of the light emitting device 10 such that the first electrode pad 12-1 and the second electrode pad 12-2 are exposed. In addition, the first electrode pad 12-1 and the second electrode pad 12-2 may have various shapes in addition to a quadrangular plate shape illustrated in FIG. 1. For example, the first electrode pad 12-1 and the second electrode pad 12-2 may have a finger structure in which a plurality of fingers are provided on one arm, a bump structure, or the like.

The light emitting device 10 may be formed of a semiconductor, as illustrated in FIG. 1. For example, light emitting diodes (LEDs) formed of a nitride semiconductor and emitting blue light, green light, red light, and yellow light, an LED formed of a nitride semiconductor and emitting ultraviolet light, an LED formed of a nitride semiconductor and emitting infrared light, or the like, may be used. In addition, the light emitting device 10 may be configured by epitaxially growing a nitride semiconductor such as InN, AlN, InGaN, AlGaN, InGaAlN, and the like, on a sapphire substrate or a silicon carbide substrate for growth by a vapor growth method such as a metal organic chemical vapor deposition (MOCVD) method, or the like. In addition, the light emitting device 10 may be formed using semiconductors such as ZnO, ZnS, ZnSe, SiC, GaP, GaAlAs, AlInGaP, and the like, in addition to the nitride semiconductor. As these semiconductors, laminates in which an n-type semiconductor layer, a light emitting layer, and a p-type semiconductor layer are sequentially stacked may be used. As the light emitting layer (active layer), a multilayer semiconductor having a multi-quantum well structure or a single quantum well structure or a multilayer semiconductor having a double hetero structure may be used. In addition, as the light emitting device 10, a light emitting device having any wavelength may be selected according to an application such as a display application, an illumination application, or the like.

In addition, the molding member 20 is formed to enclose side surfaces of the light emitting device 10 so as to be installed in a light path of light emitted in the light emitting device 10, and may include a reflecting member, a light conversion material, and the like. In addition, the molding member 20 may have downwardly inclined surfaces formed on side surfaces thereof such that a second width of an upper portion thereof is wider than a first width of a lower portion thereof, as illustrated in FIG. 1.

For example, the reflecting member may be formed of one or more selected from the group consisting of an epoxy molding compound (EMC) containing a reflecting material, white silicon, white epoxy, and a photoimageable solder resist (PSR). In addition, the reflecting member may be formed of one or more selected from the group consisting of an epoxy resin composition, a silicon resin composition, a modified epoxy resin composition, a modified silicon resin composition, a polyimide resin composition, a modified polyimide resin composition, polyphthalamide (PPA), a polycarbonate resin, polyphenylene sulfide (PPS), a liquid crystal polymer (LCP), an ABS resin, a phenol resin, an acrylic resin, and a PBT resin. Further, these resins may contain a light reflective material such as titanium oxide, silicon dioxide, titanium dioxide, zirconium dioxide, titanium potassium, alumina, aluminum nitride, boron nitride, mullite, chromium, a white based or metal based component, or the like.

In addition, the light conversion material may include a phosphor or a quantum dot (QD) converting light emitted from the light emitting device 10, emitting the converted light to a light emitting surface, and changing a wavelength of the light. Further, the phosphor needs to basically conform with stoichiometry, and the respective elements may be replaced by other elements in the respective groups in a periodic table. For example, Sr may be replaced by Ba, Ca, Mg, or the like, in an alkaline earth (II) group, and Y may be replaced by Tb, Lu, Sc, Gd, or the like, in a lanthanide. In addition, Eu, or the like, which is an activator, may be replaced by Ce, Tb, Pr, Er, Yb, or the like, depending on a desired energy level, and the activator may be used singly or a sub-activator, or the like, may be additionally used in order to change characteristics. In addition, the quantum dot may be a nanometer-sized particle that may have optical characteristics generated from quantum confinement, and may include, for example, one or more selected from the group consisting of Group IV elements, Group II-VI compounds, Group II-V compounds, Group III-VI compounds, Group III-V compounds, Group IV-VI compounds, Group compounds, Group II-IV-VI compounds, and Group II-IV-V compounds. In addition, the quantum dot may be configured in a structure of a core (3 to 10 nm) of CdSe, InP, or the like, a shell (0.5 to 2 nm) and a core of ZnS, ZnSe, or the like, and a ligand for stabilization of the shell, and may have optical characteristics that it may implement various colors depending on a size thereof.

In addition, the light conversion material may include two or more kinds of phosphor and quantum dot materials of which light emitting wavelengths are different from each other, and may be a mixture of the phosphor and the quantum dot.

Therefore, the upper adhesive sheet 120 may stably support one or more light emitting device packages 100, and the first electrode pad 12-1 and the second electrode pad 12-2 of the light emitting device 10 may be exposed to the outside to allow a test process of the light emitting device 10 to be efficiently performed.

Figure 2:
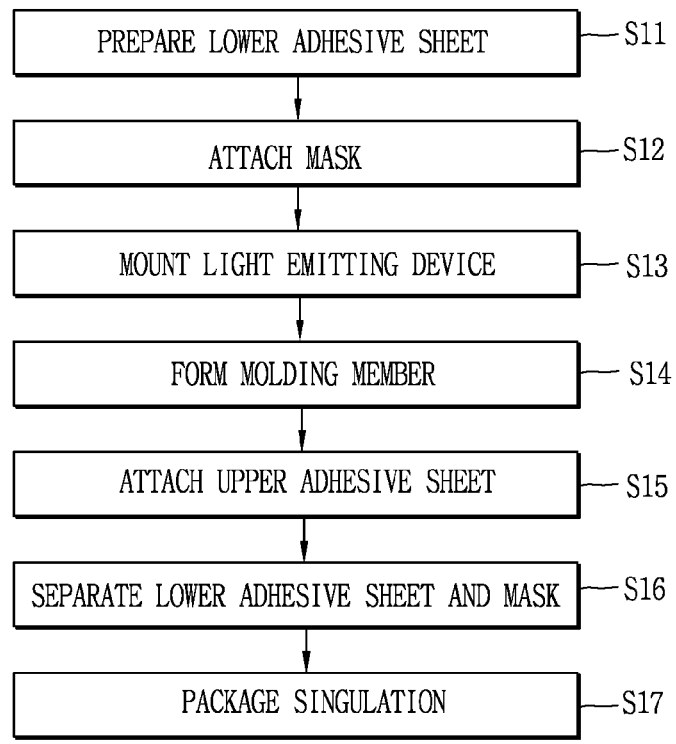
FIG. 2 is a flow chart illustrating a method of manufacturing a light emitting device package according to an exemplary embodiment of the present invention.
Figure 3:
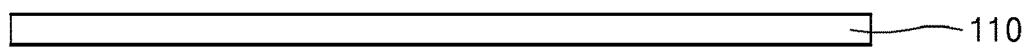
FIGS. 3, 4, 6, 8, 10, 12, and 14 are cross-sectional views illustrating steps of the method of manufacturing a light emitting device package of FIG. 2.
Figure 4:
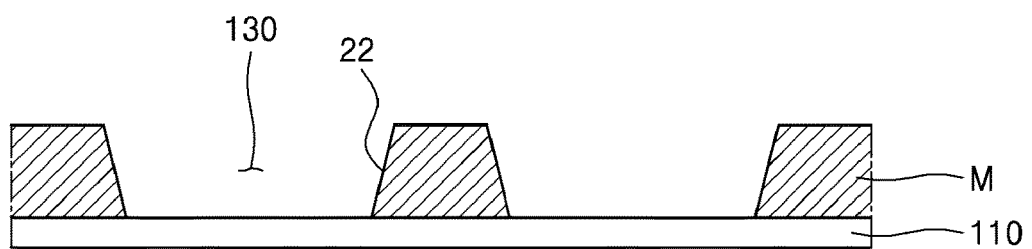
Figure 5:
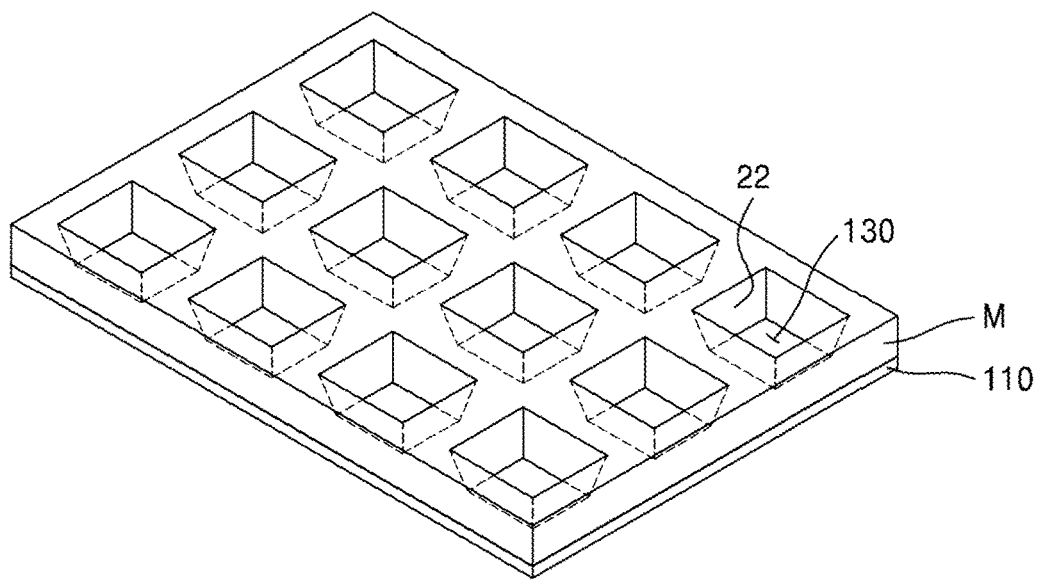
FIGS. 5, 7, 9, 11, 13, and 15 are perspective views illustrating steps of the method of manufacturing a light emitting device package of FIG. 2.
Figure 6:
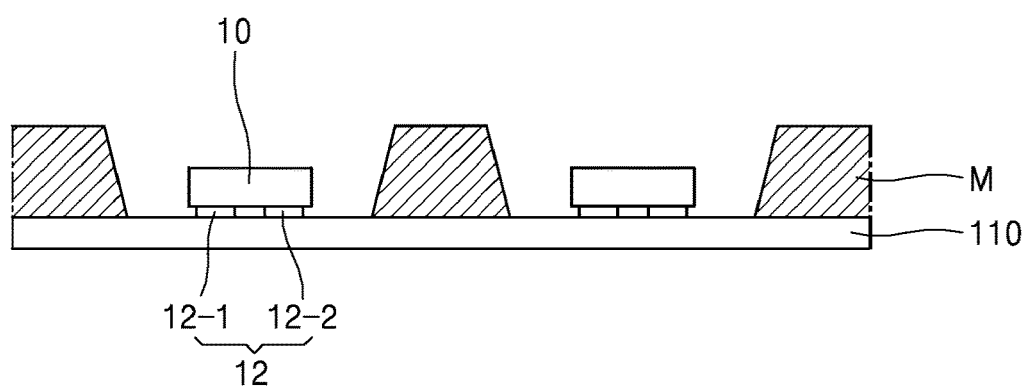
Figure 7:
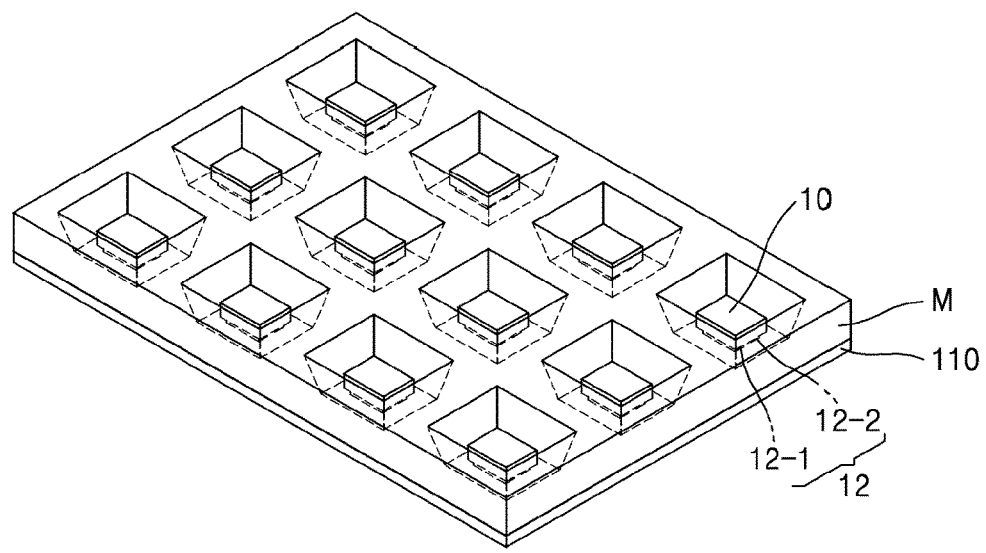

FIG. 2 is a flow chart illustrating a method of manufacturing a light emitting device package according to an exemplary embodiment of the present invention, FIGS. 3, 4, 6, 8, 10, 12, and 14 are cross-sectional views illustrating steps of the method of manufacturing a light emitting device package of FIG. 2, and FIGS. 5, 7, 9, 11, 13, and 15 are perspective views illustrating steps of the method of manufacturing a light emitting device package of FIG. 2.

As illustrated in FIG. 2, the method of manufacturing a light emitting device package according to an exemplary embodiment of the present invention may include a lower adhesive sheet preparing step (S11), a mask attaching step (S12), a light emitting device mounting step (S13), a molding member forming step (S14), an upper adhesive sheet attaching step (S15), a lower adhesive sheet and mask separating step (S16), and a package singulation step (S17).

In more detail, for example, as illustrated in FIGS. 3 to 15, the method of manufacturing a light emitting device package according to an exemplary embodiment of the present invention may include the lower adhesive sheet preparing step (S11) of preparing a lower adhesive sheet 110 having an adhesive applied onto an upper surface thereof, the mask attaching step (S12) of attaching a mask M onto the upper surface of the lower adhesive sheet 110, the mask M having one or more light emitting device package accommodating cavities 130, the light emitting device mounting step (S13) of mounting one or more light emitting devices 10 on the lower adhesive sheet 110 such that the light emitting devices 10 are accommodated in the light emitting device package accommodating cavities 130, the molding member forming step (S14) of forming molding members 20 en bloc in the light emitting device package accommodating cavities 130 so as to enclose the light emitting devices 10, the upper adhesive sheet attaching step (S15) of attaching an upper adhesive sheet 120 onto upper surfaces of the molding members 20 and the mask M, the lower adhesive sheet and mask separating step (S16) of separating the lower adhesive sheet 110 and the mask M from the light emitting devices 10 and the molding members such that lower surface electrode pads 12 of the light emitting devices 10 are exposed, and the package singulation step (S17) of singulating a package into unit packages by removing the upper adhesive sheet 120.

In addition, in the package singulation step (S17), the unit packages may be mounted on a substrate at a time while maintaining their shapes in a state in which the upper adhesive sheet 120 is removed or be separately mounted on the respective substrates one by one.

Here, the light emitting device package accommodating cavities 130 may be variously formed in a cylindrical shape or a poly-prismatic shape. In addition, the light emitting device package accommodating cavities 130 may be formed in the mask M such that the lower surface electrode pads 12 of the light emitting devices 10 are directly mounted on the upper surface of the lower adhesive sheet 110 when the light emitting devices 10 are mounted. In addition, the mask M may include reflection cup parts 22 having an inclined surface having a first angle. The first angle may be formed such that an upper portion of the light emitting device package accommodating cavity 130 is wide and a lower portion of the light emitting device package accommodating cavity 130 is narrow. In addition, a releasing agent P may be applied onto an upper surface of the mask M. Therefore, in the lower adhesive sheet and mask separating step (S16), the mask M may be separated together with the lower adhesive sheet 110 downwardly, and the light emitting devices 10 and the molding members 20 may be easily separated together with the upper adhesive sheet 120 upwardly, by the first angle. In addition, the mask M may be separated well from the upper adhesive sheet 120 and the molding members 20 due to the releasing agent P.

Figure 8:
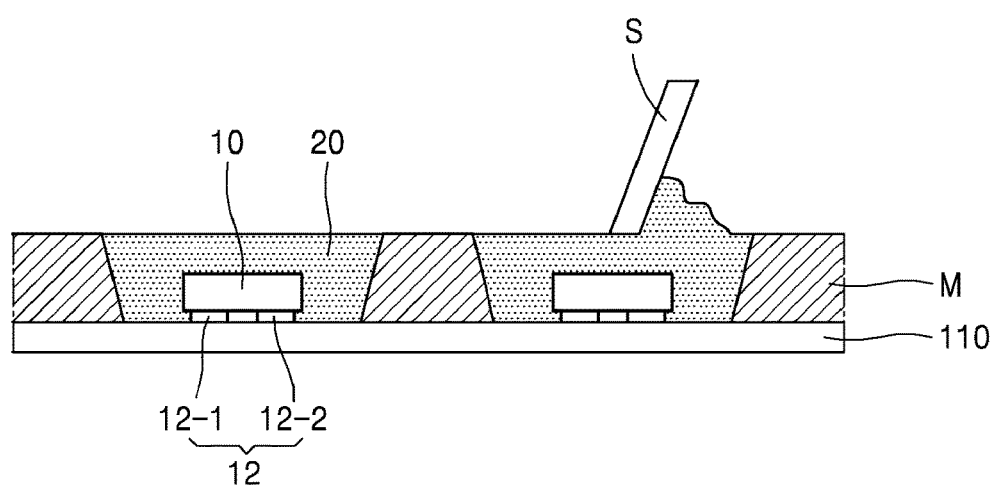
Figure 9:
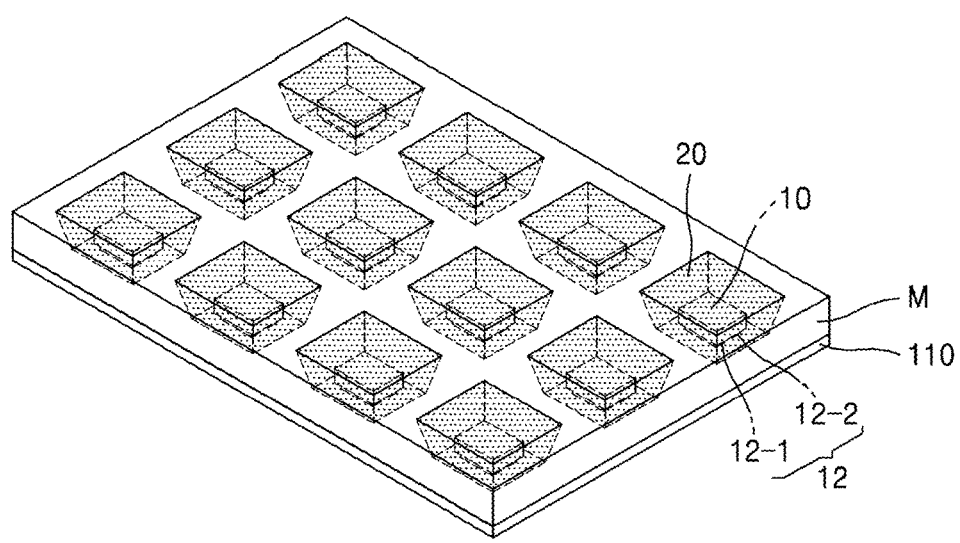
Figure 10:
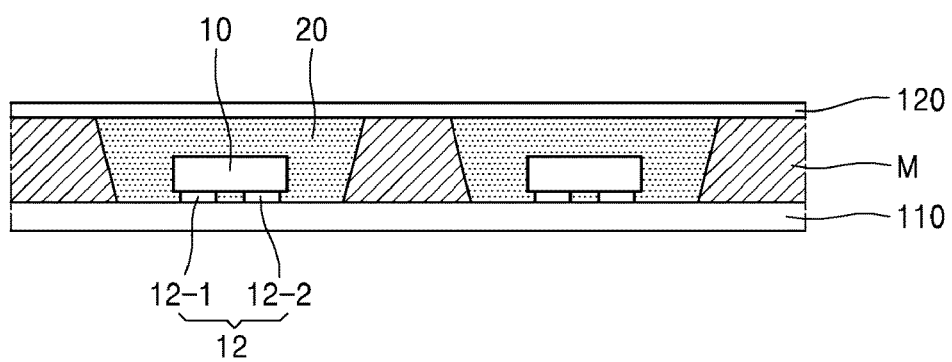
Figure 11:
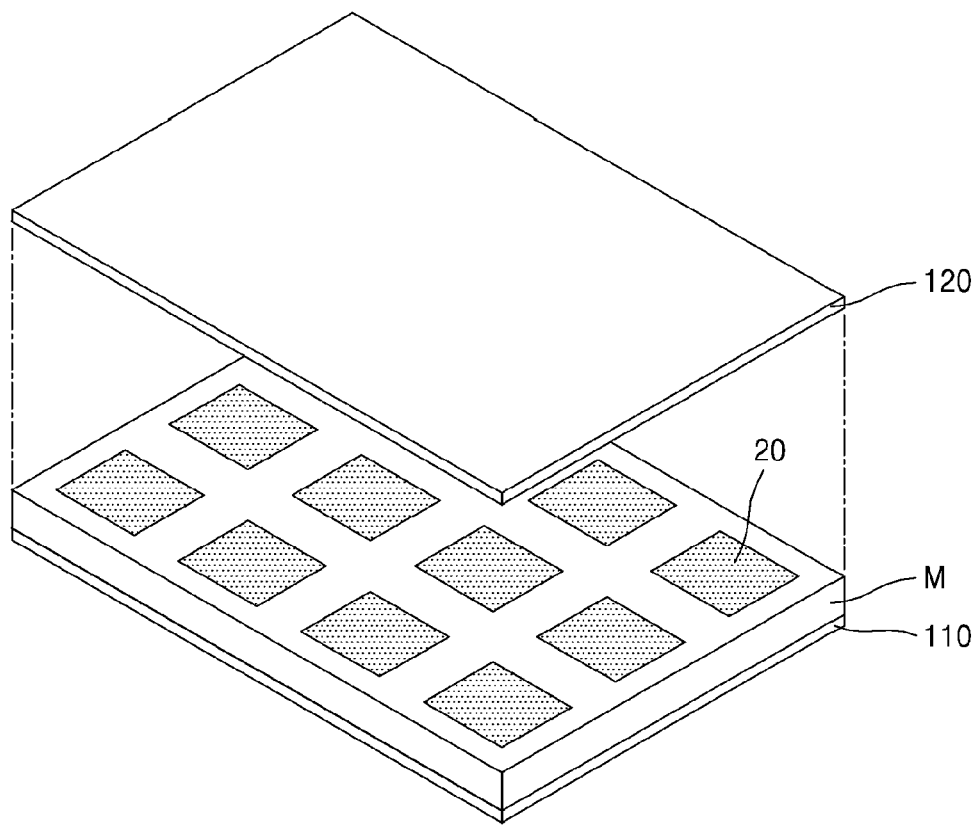
Figure 12:
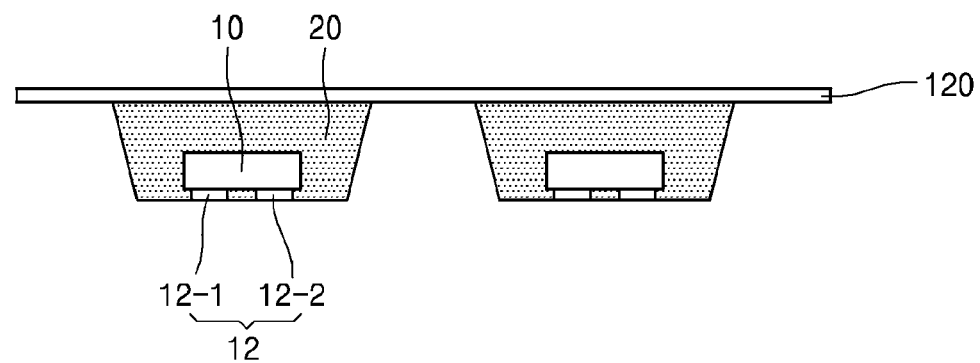
Figure 13:
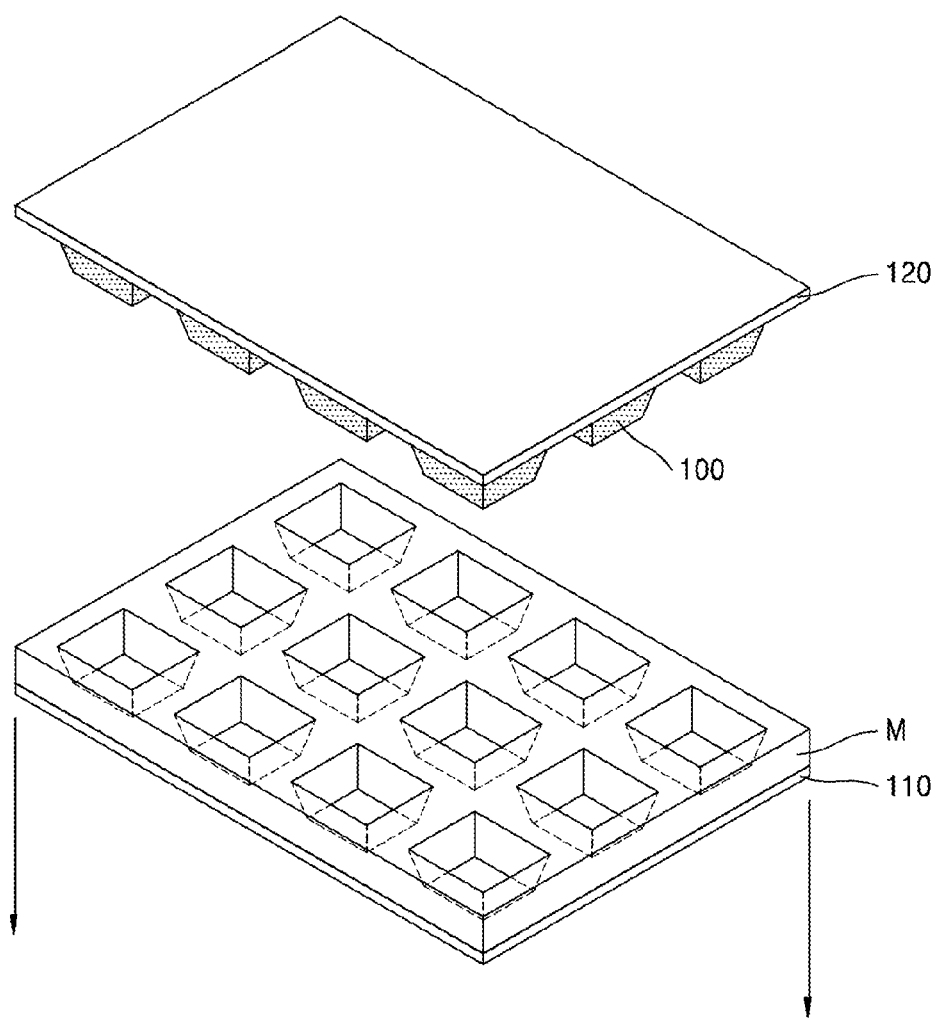
Figure 14:
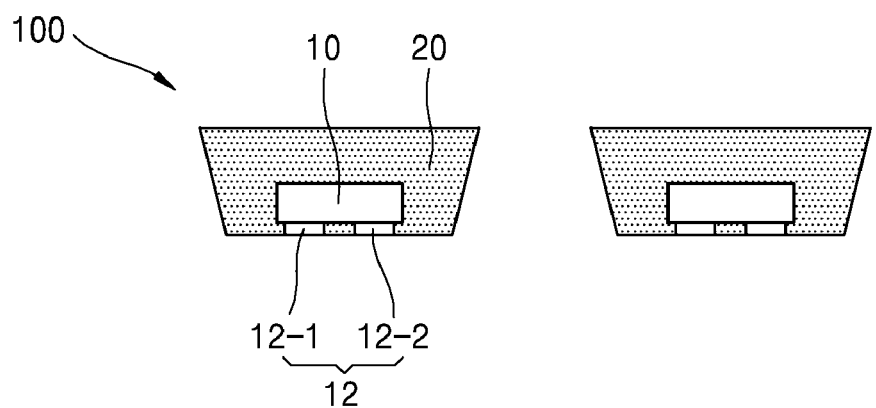
Figure 15:
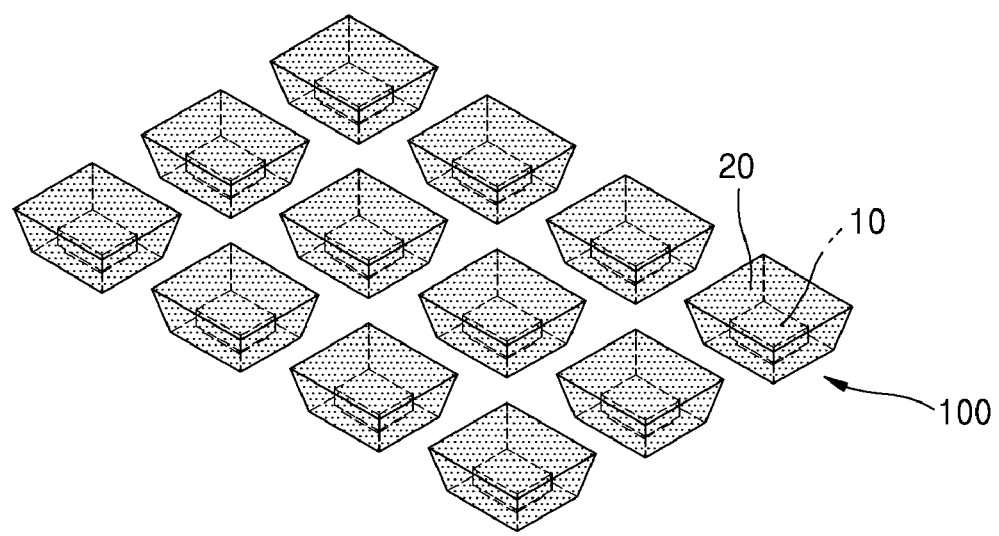

In addition, in the molding member forming step (S14), the molding members 20 may be formed en bloc by a squeeze printing method, as illustrated in FIG. 8. Therefore, one or more light emitting device packages may be manufactured en bloc by a simple process, and the method of manufacturing a light emitting device package of which productivity is improved and a cost is reduced may be implemented.

In addition, in the molding member forming step (S14), first molding members including phosphor particles having a first density may be formed at a lower portion, second molding members including phosphor particles having a second density may be formed at an upper portion, and the first density may be larger than the second density. Here, the molding members 20 may be sequentially formed by injecting the first molding members and then injecting the second molding members or be formed by injecting molding members in which a plurality of phosphor particles having different densities are mixed with each other.

Figure 16:
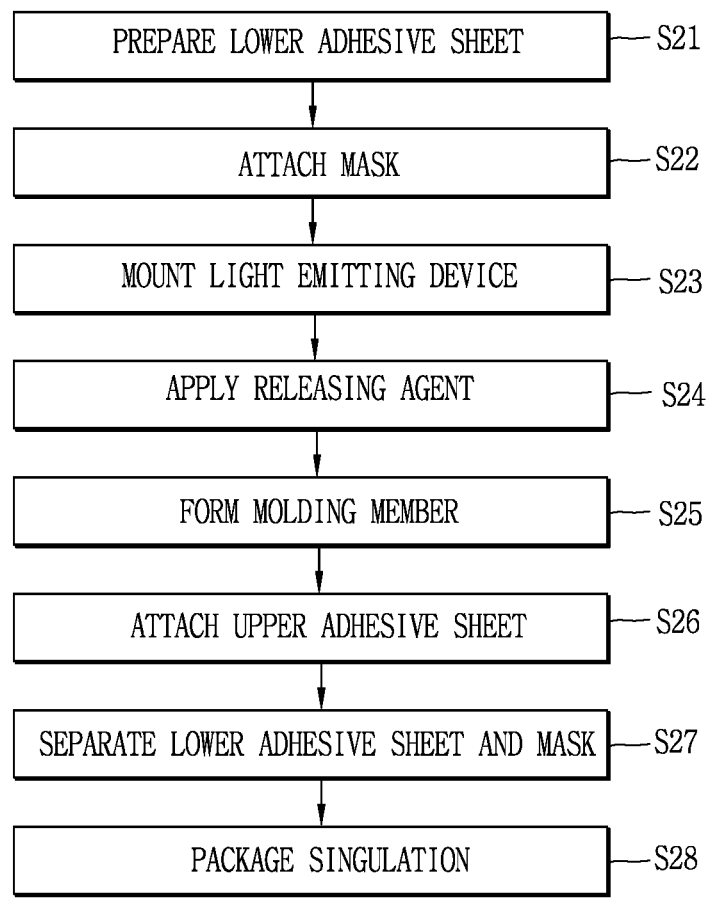
FIG. 16 is a flow chart illustrating a method of manufacturing a light emitting device package according to another exemplary embodiment of the present invention.
Figure 17:
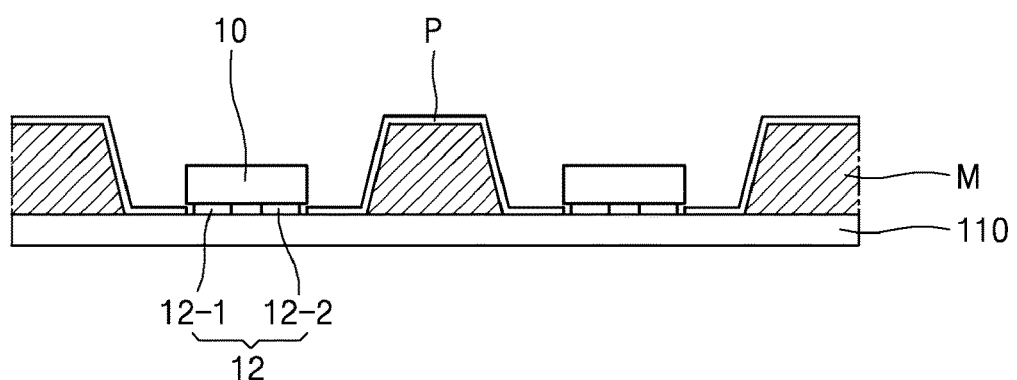
FIG. 17 is a cross-sectional view illustrating a releasing agent applying step of FIG. 16.
Figure 18:
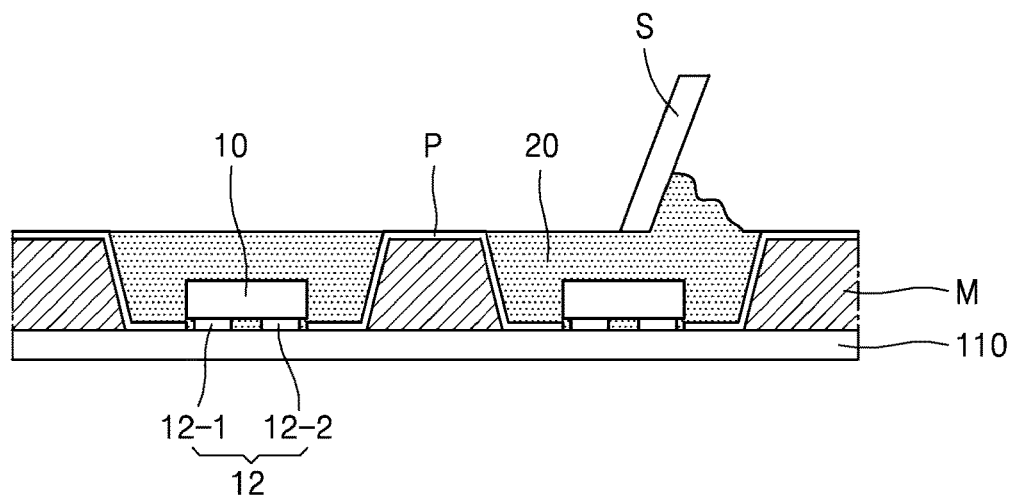
FIG. 18 is a cross-sectional view illustrating a molding member forming step of FIG. 16.
Figure 19:
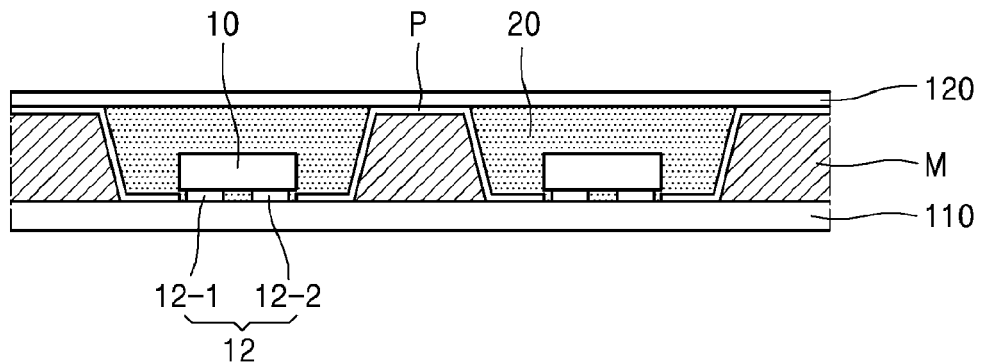
FIG. 19 is a cross-sectional view illustrating an upper adhesive sheet attaching step of FIG. 16.

FIG. 16 is a flow chart illustrating a method of manufacturing a light emitting device package according to another exemplary embodiment of the present invention, FIG. 17 is a cross-sectional view illustrating a releasing agent applying step (S24) of FIG. 16, FIG. 18 is a cross-sectional view illustrating a molding member forming step (S25) of FIG. 16, and FIG. 19 is a cross-sectional view illustrating an upper adhesive sheet attaching step (S26) of FIG. 16.

As illustrated in FIGS. 16 to 19, the method of manufacturing a light emitting device package according to another exemplary embodiment of the present invention may include a lower adhesive sheet preparing step (S21), a mask attaching step (S22), a light emitting device mounting step (S23), a releasing agent applying step (S24), a molding member forming step (S25), an upper adhesive sheet attaching step (S26), a lower adhesive sheet and mask separating step (S27), and a package singulation step (S28).

Here, the lower adhesive sheet preparing step (S21), the mask attaching step (S22), the light emitting device mounting step (S23), the molding member forming step (S25), the upper adhesive sheet attaching step (S26), the lower adhesive sheet and mask separating step (S27), and the package singulation step (S28) may be the same as the corresponding steps of the method of manufacturing a light emitting device package according to the exemplary embodiment of the present invention illustrated in FIGS. 3 to 15. Therefore, a detailed description for these steps will be omitted.

For example, the releasing agent applying step (S24) may be a step of applying a releasing agent P onto upper surfaces of the upper adhesive sheet 120 and the mask M after the light emitting device mounting step (S23). Here, as the releasing agent P, a talc powder or silicon oil that does not have adhesion may be used. In addition, the releasing agent applying step (S24) may be a step of using one or more of a stencil printed process, an inkjet applying process, a spray applying process, and a rolling applying process.

Therefore, the mask M may be separated well from the upper adhesive sheet 120 and the molding members 20 in the lower adhesive sheet and mask separating step (S27), such that the light emitting device package strip 1000 is easily manufactured.

In addition, according to the exemplary embodiment of the present invention configured as described above, the light emitting devices 10 may be uniformly arranged, such that a defect of the light emitting device package may be reduced, and heights and side surface thicknesses of phosphors applied to the respective light emitting devices 10 may be uniform using the mask M depending on a required dimension, such that optical characteristics may be improved.

Figure 20:
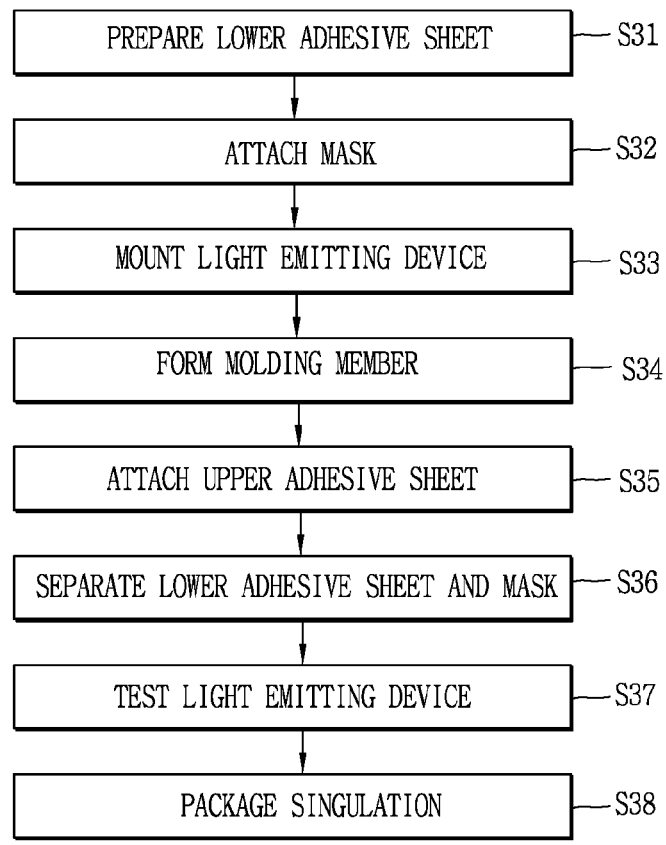
FIG. 20 is a flow chart illustrating a method of manufacturing a light emitting device package according to still another exemplary embodiment of the present invention.

FIG. 20 is a flow chart illustrating a method of manufacturing a light emitting device package according to still another exemplary embodiment of the present invention.

As illustrated in FIG. 20, the method of manufacturing a light emitting device package according to still another exemplary embodiment of the present invention may include a lower adhesive sheet preparing step (S31), a mask attaching step (S32), a light emitting device mounting step (S33), a molding member forming step (S34), an upper adhesive sheet attaching step (S35), a lower adhesive sheet and mask separating step (S36), a light emitting device test step (S37), and a package singulation step (S38).

Here, the lower adhesive sheet preparing step (S31), the mask attaching step (S32), the light emitting device mounting step (S33), the molding member forming step (S34), the upper adhesive sheet attaching step (S35), the lower adhesive sheet and mask separating step (S36), and the package singulation step (S38) may be the same as the corresponding steps of the method of manufacturing a light emitting device package according to the exemplary embodiment of the present invention illustrated in FIGS. 3 to 15. Therefore, a detailed description for these steps will be omitted.

In addition, the light emitting device test step (S37) may be a step of testing a defect of the light emitting device 10 through the exposed lower surface electrode pads 12. For example, since the light emitting device test step (S37) is performed after the lower adhesive sheet and mask separating step (S36), the light emitting device test step (S37) may be performed in a state in which the electrode pads 12 are exposed to the outside.

Therefore, a test process may be performed on a line in which the light emitting device package is manufactured without forming a separate additional process for the test process, such that efficiency of the test process may be improved and a time required for all processes may be significantly reduced.

Next, in a process of pushing a reflective resin material using a squeeze to closely adhere the reflective resin material to the light emitting devices, an unstable interface may be formed between the light emitting devices and a reflector, damage may be applied to the light emitting devices, and an unwanted bend or an irregular surface may be caused in a finally formed reflector. In addition, in the related art, an unwanted bend or an irregular surface may be caused in a finally formed phosphor layer. This may be solved by a chip scale light emitting device package manufactured to include a preformed reflector sheet preformed in a sheet form.

In this regard, a light emitting device package 100 according to another exemplary embodiment of the present invention will be described with reference to FIGS. 21 to 25.

Figure 21:
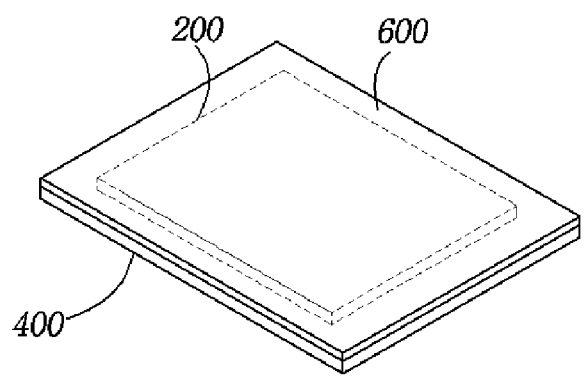
FIG. 21 is a top perspective view illustrating a chip scale light emitting device package according to an exemplary embodiment of the present invention.
Figure 22:
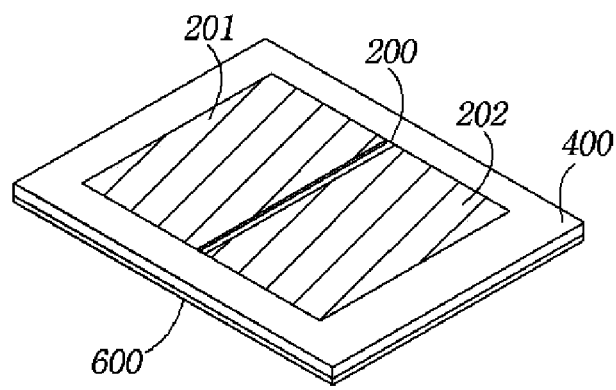
FIG. 22 is a bottom perspective view illustrating the chip scale light emitting device package according to an exemplary embodiment of the present invention.
Figure 23:
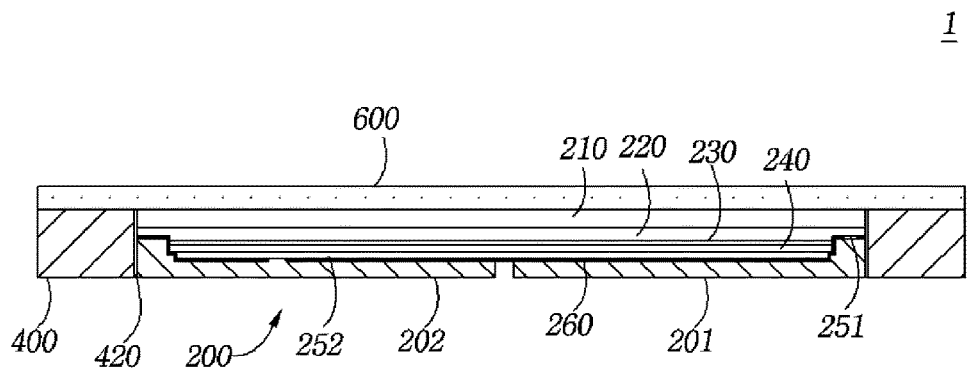
FIG. 23 is a cross-sectional view illustrating the chip scale light emitting device package according to an exemplary embodiment of the present invention.

As illustrated in FIGS. 21 to 23, a chip scale light emitting device package 1 according to an exemplary embodiment of the present invention includes a light emitting device 200 having an upper surface, a lower surface, and side surfaces, and a preformed reflector sheet 400 formed to cover the side surfaces of the light emitting device 200. In addition, the chip scale light emitting device package 1 may further include a phosphor sheet 600 attached onto an upper surface of the preformed reflector sheet 400. Here, the preformed reflector sheet may be one form of the molding member described above.

The light emitting device 200 may include a first electrode pad 201 and a second electrode pad 202 provided on the lower surface thereof for the purpose of electrical connection to an external electrical circuit. The light emitting device 200 is not limited to the light emitting device 200 illustrated in the drawings, but may also have various types, shapes, or structures as long as it includes electrode pads provided on the lower surface thereof and having different polarities.

Preferably, the light emitting device 200 may be a flip-chip type light emitting device as illustrated in FIG. 23. For example, the light emitting device 200 may include a light transmitting substrate 210, a first conductive-type semiconductor layer 220, an active layer 230, and a second conductive type semiconductor layer 240 sequentially disposed from the top toward the bottom, and may be a flip-chip type light emitting device in which a first conductive-type pad 251 of a region of the first conductive-type semiconductor layer 220 opened by mesa etching and a second conductive-type pad 252 of a region of the second conductive-type semiconductor layer 240 are bonded, respectively, to the first electrode pad 201 and the second electrode pad 202 on the lower surface of the light emitting device 200.

An insulating layer 260 is formed to insulate the first electrode pad 201 from the second conductive-type semiconductor layer 240 and the second conductive-type pad 252 and insulate the second electrode pad 202 from the first conductive-type semiconductor layer 220 and the first conductive-type pad 251. The light transmitting substrate 210 may be a growth substrate used to grow the first conductive-type semiconductor layer 220 formed of a gallium nitride based material, the active layer 230, and the second conductive-type semiconductor layer 240, more preferably, a sapphire substrate 210. The first conductive-type semiconductor layer 220 and the second conductive-type semiconductor layer 240 may be an n-type semiconductor layer and a p-type semiconductor layer.

In addition, the light emitting device 200 includes facing side surfaces facing inner side surfaces of a hole 420 of the preformed reflector sheet 400, and the facing side surfaces of the light emitting device 200 include side surfaces of the first conductive-type semiconductor layer 220 and side surfaces of the first or second electrode pad 201 or 202. Further, the facing side surfaces may further include side surfaces of the light transmitting substrate 210 configuring the upper surface of the light emitting device 200. In addition, portions extended from the insulating layer 260 may be interposed between the facing side surfaces and the inner side surfaces of the preformed reflector sheet 400. Further, it is preferable that the phosphor sheet 600 contacts the light transmitting substrate 200 configuring the upper surface of the light emitting device 200.

Again referring to FIGS. 21 to 23, the preformed reflector sheet 400 may include a quadrangular hole 420 allowing the light emitting device 200 to be inserted thereinto while being formed to be extended from the upper surface thereof to a lower surface thereof. The inner side surfaces of the hole 420 face outer side surfaces of the light emitting device 200, and an adhesive material is interposed between the inner side surfaces of the hole 420 and the light emitting device 200 to fix the light emitting device 200 into the hole 420. The lower surface of the light emitting device 200 and the first electrode pad 201 and the second electrode pad 202 provided on the lower surface of the light emitting device 200 are exposed to the outside through a lower portion of the hole 420. A height of the light emitting device 200 is substantially the same as a height of the preformed reflector sheet 400 and a depth of the hole 420. Therefore, the upper surface of the light emitting device 200 and the upper surface of the preformed reflector sheet 400 may be coplanar with each other. In addition, the lower surface of the light emitting device 200, more specifically, lower surfaces of the first electrode pad 201 and the second electrode pad 202 may be coplanar with the lower surface of the preformed reflector sheet 400.

It is preferable that the preformed reflector sheet 400 is manufactured from a sheet for a reflector preformed by mixing one or more reflecting materials selected from the group consisting of $TiO_2$, $SiO_2$, $ZrO_2$, $PbCO_3$, $PbO$, $Al_2O_3$, $ZnO$, and $Sb_2O_3$ with a silicon resin, an epoxy resin, or a resin including at least one of the silicon resin and the epoxy resin. The most preferable sheet for a reflector may be formed by molding a mixture of a silicon resin and $TiO_2$ in a sheet shape. However, a material of the sheet for a reflector is not limited thereto. That is, white epoxy or white silicon implemented by other reflecting materials, an epoxy molding compound containing a reflecting material, or the like, may be used as a material of the sheet for a reflector. Here, it is noted that since the sheet for a reflector is formed to have smooth upper and lower surfaces by a molding process performed in advance, a (unintended) rough surface or a bend that may have a negative influence on performance of the chip scale light emitting device package 1 is not present.

Actually, a term "sheet for a reflector" indicates the same portion as the "preformed reflector sheet", but is used in order to be distinguished from a preformed reflector sheet, which is a portion of a finally completed chip scale light emitting device package, and will be denoted by a reference numeral different from that of the preformed reflector sheet.

The phosphor sheet 600 is attached onto the upper surface of the preformed reflector sheet 400 and the upper surface of the light emitting device 200 by an adhesive material. An upper portion of the hole 420 is closed by the phosphor sheet 600, and the light emitting device 200 is fixed into the hole 420 below the phosphor sheet 600. Since a thickness of the adhesive material is ignorable, it may be considered that the phosphor sheet 600 contacts both of the upper surface of the preformed reflector sheet 400 and the upper surface of the light emitting device 200. The phosphor sheet 600 may be formed by molding a resin in which a phosphor is uniformly included. Alternatively, the phosphor sheet 600 may also be formed by uniformly coating a phosphor to a light transmitting sheet.

Figure 24:
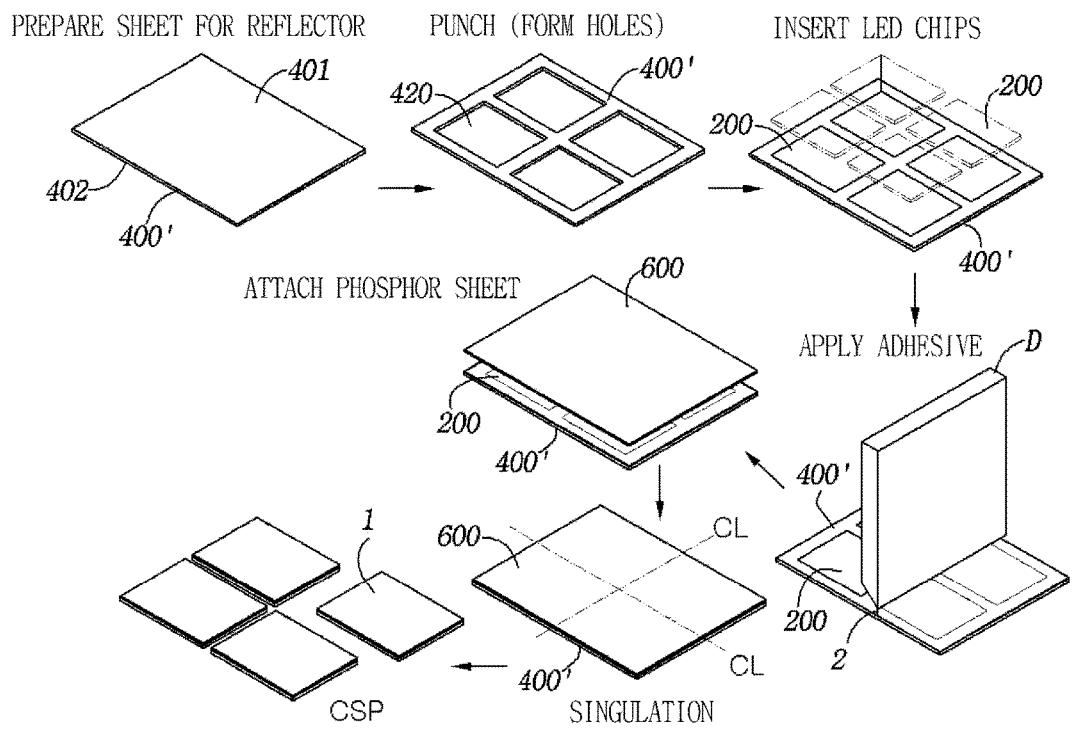
FIG. 24 is a view for describing a method of manufacturing a chip scale light emitting device package according to an exemplary embodiment of the present invention.

A method of manufacturing a chip scale light emitting device package according to an exemplary embodiment of the present invention is illustrated in FIG. 24.

Referring to FIG. 24, the method of manufacturing a chip scale light emitting device package according to the present exemplary embodiment includes a step of preparing a sheet 400' for a reflector having an upper surface 401 and a lower surface 402 and having a plurality of holes 420 formed therein, a step of inserting a plurality of light emitting devices 200 prepared in advance to the plurality of holes 420, a step of attaching a phosphor sheet 600 prepared in advance onto the upper surface 401 of the sheet 400' for a reflector so as to cover upper surfaces of the light emitting devices 200, and a singulation step of cutting a laminate of the sheet 400' for a reflector and the phosphor sheet 600 in a chip unit.

It is preferable that the sheet 400' for a reflector is a sheet for a reflector preformed by mixing one or more reflecting materials selected from the group consisting of $TiO_2$, $SiO_2$, $ZrO_2$, $PbCO_3$, PbO, $Al_2O_3$, ZnO, and $Sb_2O_3$ with a silicon resin, an epoxy resin, or a resin including at least one of the silicon resin and the epoxy resin, and the most preferable sheet 400' for a reflector is formed by molding a mixture of a silicon resin and $TiO_2$ in a sheet shape. However, a material of the sheet for a reflector is not limited thereto. That is, white epoxy or white silicon implemented by other reflecting materials, an epoxy molding compound containing a reflecting material, or the like, may be used as a material of the sheet for a reflector.

In addition, the plurality of holes 420 may be formed in a quadrangular shape corresponding to that of the light emitting device 200 by a process of punching the sheet 400' for a reflector. In addition, the sheet 400' for a reflector may be formed to have a thickness that is substantially the same as a height of the light emitting device 200. In this case, a depth of the hole 420 is the same as a height of the sheet 400' for a reflector and the height of the light emitting device 200.

The light emitting device 200 may be formed in a flip-chip structure as described above with reference to FIG. 23, and include a first electrode pad 201 and a second electrode pad 202 provided on a lower surface thereof. The light emitting device 200 is inserted into the hole 420 such that outer side surfaces thereof substantially contact inner side surfaces of the hole 420, and is adhered into the hole 420 by an adhesive. The first electrode pad 201 and the second electrode 202 are exposed to the outside of the hole 420 through a lower portion of the hole 420.

Before the step of attaching the phosphor sheet 600 onto the upper surface 401 of the sheet 400' for a reflector, an adhesive 2 covering the upper surface 401 of the sheet 400' for a reflector and upper surfaces of the light emitting devices 200 is applied using an adhesive dispenser D. When a structure in which the phosphor sheet 600 or the sheet 400' for a reflector is covered and protected by a release paper after an adhesive material is applied onto one surface of the phosphor sheet 600 or the sheet 400' for a reflector in advance is applied to the phosphor sheet 600 or the sheet 400' for a reflector, a separate process for applying an adhesive may also be omitted.

As the phosphor sheet 600, a phosphor sheet formed by putting a liquid-phase or gel-phase light transmitting resin including a phosphor into a frame and molding the liquid-phase or gel-phase light transmitting resin in a sheet shape may be used. Alternatively, a phosphor sheet formed by uniformly coating a phosphor onto an upper surface or a lower surface of a light transmitting resin sheet may be used. Here, as the light transmitting resin, a resin including a silicon resin or an epoxy resin may be used. The phosphor may be selected depending on a wavelength of light emitted by the light emitting device 200 and an intended color or color temperature of emitted light targeted in the chip light emitting device package 1.

In the singulation step, the laminate of the phosphor sheet 600 and the sheet 400' for a reflector manufactured as described above is cut along cutting lines CL (for example, by a sawing process) to be singulated into a plurality of chip scale light emitting device packages 1 each including one light emitting device 200. A singulation step of allowing individual chip scale light emitting device packages 1 to include two or more light emitting devices 200 may also be considered, if necessary.

Figure 25:
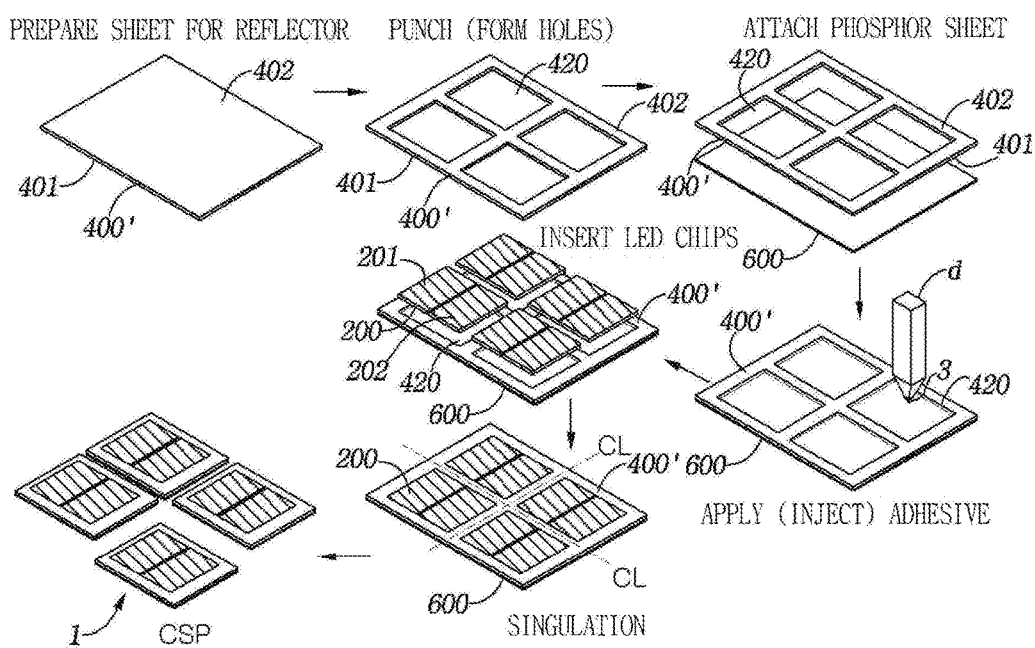
FIG. 25 is a view for describing a method of manufacturing a chip scale light emitting device package according to another exemplary embodiment of the present invention.

A method of manufacturing a chip scale light emitting device package according to another exemplary embodiment of the present invention is illustrated in FIG. 25.

Referring to FIG. 25, the method of manufacturing a chip scale light emitting device package according to the present exemplary embodiment includes a step of preparing a sheet 400' for a reflector having an upper surface 401 and a lower surface 402 and having a plurality of holes 420 formed therein, a step of adhering a phosphor sheet 600 molded in advance onto the upper surface 401 of the sheet 400' for a reflector to close upper portions of the plurality of holes 420, a step of inserting the plurality of light emitting devices 200 to the plurality of holes 420, and a singulation step of cutting a laminate of the sheet 400' for a reflector and the phosphor sheet 600. It is noted that a case in which upper surfaces of all of the sheet 400' for a reflector, the phosphor sheet 600, the light emitting devices 200, and the chip scale light emitting device package 1 are directed downward and lower surfaces thereof are directed upward is illustrated in FIG. 25 for convenience.

Like the previous exemplary embodiment, each of the plurality of holes 420 may be formed to have a shape and a size corresponding to those of the light emitting device 200 by punching the sheet 400' for a reflector. Unlike the previous exemplary embodiment, in a state in which the light emitting devices 200 are not inserted into the holes 420, the phosphor sheet 600 molded in advance is adhered onto the upper surface 401 of the sheet 400' for a reflector to close the upper portions of the holes 420. Therefore, the holes 420 become closed holes allowing insertion of the light emitting devices 200 only from a lower side. In order to attach the phosphor sheet 600 onto the upper surface 401 of the sheet 400' for a reflector, it is required for an adhesive to be applied so as to cover the upper surface 401 of the sheet 400' for a reflector. When a structure in which the phosphor sheet 600 or the sheet 400' for a reflector is covered and protected by a release paper after an adhesive material is applied onto one surface of the phosphor sheet 600 or the sheet 400' for a reflector in advance is applied to the phosphor sheet 600 or the sheet 400' for a reflector, a separate process for applying an adhesive may also be omitted.

Before the plurality of light emitting devices 200 are inserted into the plurality of holes 420, an adhesive 3 may be applied into the holes 420 of the sheet 400' for a reflector closed by the phosphor sheet 600. An adhesive dispenser d may be used in order to apply the adhesive 3.

Next, the light emitting devices 200 are inserted into the closed holes 420. Therefore, the light emitting devices 200 are fixed into the holes 420 by the adhesive below the phosphor sheet 600. Here, first and second electrode pads 201 and 202 provided on a lower surface of the light emitting device 200 are exposed to the outside through a lower portion of the closed hole 420, and an upper surface of the light emitting device 200 contacts a lower surface of the phosphor sheet 600. Like the previous exemplary embodiment, a height of the light emitting device is substantially the same as a height of the sheet 400' for a reflector and a depth of the hole 420. Therefore, the upper surface of the light emitting device 200 and the upper surface of the sheet 400' for a reflector may be coplanar with each other. In addition, the lower surface of the light emitting device 200, more specifically, lower surfaces of the first electrode pad 201 and the second electrode pad 202 may be coplanar with the lower surface of the sheet 400' for a reflector.

Also in the present exemplary embodiment, the laminate of the phosphor sheet and the sheet 400' for a reflector manufactured finally is cut along cutting lines CL to finally manufacture a plurality of chip scale light emitting device packages 1 including one or more light emitting devices 200.

According to the exemplary embodiment of the present invention configured as described above, the light emitting device package strip in which the defect of the light emitting device package may be reduced through a chip scale package process through which the light emitting devices may be uniformly arranged, the heights and the side surface thicknesses of the phosphors applied to the respective light emitting devices may be uniform, the optical characteristics may be improved, the efficiency of the test process may be improved, the time required for processes may be reduced may be implemented.

The preformed reflector sheet prepared in advance so as to have the hole into which the light emitting device is inserted is used as the reflector. The preformed reflector sheet may form a stable interface between the preformed reflector sheet and the light emitting device inserted and fixed into the hole, and a smooth surface that does not have a bend or a rough surface is formed, thereby improving performance and reliability of the finally manufactured light emitting device package (particularly, the chip scale light emitting device package). Therefore, the chip scale light emitting device package of which color reproducibility and reliability are significantly improved is implemented.

In addition, the preformed reflector sheet prepared in advance so as to have the hole into which the light emitting device is inserted is used as the reflector, and the phosphor sheet molded in advance and attached onto the upper surface of the preformed reflector sheet is also used, thereby making it possible to implement the chip scale light emitting device package of which color reproducibility and reliability are improved. Further, in the present invention, damage or impact applied to the light emitting device that may occur in a process of manufacturing the chip scale light emitting device package including both of the reflector and the phosphor may be significantly reduced.

What is claimed is:

1. A light emitting device package comprising:
a light emitting device having a first electrode pad and a second electrode pad; and
a molding member including a preformed reflector sheet having an upper surface, a lower surface, and a hole connected from the upper surface to the lower surface,
wherein the light emitting device is inserted and fixed into the hole, the first electrode pad and the second electrode pad are exposed to the outside of the hole, and lower surfaces of the first electrode pad and the second electrode pad are coplanar with the lower surface of the preformed reflector sheet;
wherein the light emitting device includes: a light transmitting substrate, a first conductive-type semiconductor layer, an active layer, and a second conductive-type semiconductor layer sequentially disposed from a top toward a bottom of the light emitting device;
wherein the light emitting device is a flip-chip light emitting device in which a first conductive-type pad of a region of the first conductive-type semiconductor layer opened by mesa etching and a second conductive-type pad of a region of the second conductive-type semiconductor layer are bonded to the first electrode pad and the second electrode pad, respectively;
wherein a light transmitting substrate, the first conductive-type semiconductor layer, the first electrode pad and the second electrode pad are enclosed by inner side surfaces of the preformed reflector sheet to be vertically contacted without empty space;
wherein the upper surface of the light emitting device and the upper surface of the preformed reflector sheet are coplanar with each other; and
wherein bottom surfaces of the reflector sheet, the first electrode pad and the second electrode pad are exposed such that the bottom surfaces of the first electrode pad and the second electrode pad are capable of one or more electrical connections.

2. The light emitting device package of claim 1, wherein the light emitting device package further includes a phosphor sheet attached onto the upper surface of the preformed reflector sheet so as to close an upper portion of the hole.

3. The light emitting device package of claim 2, wherein the phosphor sheet is attached onto both of the upper surfaces of the light emitting device and the upper surface of the preformed reflector sheet.

4. The light emitting device package of claim 1, wherein a height of the light emitting device is the same as a height of the preformed reflector sheet and a depth of the hole.

5. The light emitting device package of claim 1, wherein side surfaces of the light emitting device contact inner side surfaces of the hole.

6. The light emitting device package of claim 1, wherein the preformed reflector sheet is manufactured from a sheet for a reflector preformed by mixing one or more reflecting materials selected from the group consisting of $TiO_2$, $SiO_2$, $ZrO_2$, $PbCO_3$, $PbO$, $Al_2O_3$, $ZnO$, and $Sb_2O_3$ with a resin at least partially including a silicon resin or an epoxy resin.

* * * * *